US009870939B2

(12) United States Patent
Linewih et al.

(10) Patent No.: US 9,870,939 B2
(45) Date of Patent: Jan. 16, 2018

(54) RC-STACKED MOSFET CIRCUIT FOR HIGH VOLTAGE (HV) ELECTROSTATIC DISCHARGE (ESD) PROTECTION

(71) Applicant: GLOBALFOUNDRIES Singapore Pte. Ltd., Singapore (SG)

(72) Inventors: Handoko Linewih, Singapore (SG); Ming Li, Singapore (SG); Sevashanmugam Marimuthu, Kulim (MY); Ronghua Yu, Malta, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 110 days.

(21) Appl. No.: 14/838,375

(22) Filed: Aug. 28, 2015

(65) Prior Publication Data

US 2016/0155737 A1    Jun. 2, 2016

Related U.S. Application Data

(60) Provisional application No. 62/085,630, filed on Nov. 30, 2014.

(51) Int. Cl.
| | |
|---|---|
| H02H 3/22 | (2006.01) |
| H01L 21/762 | (2006.01) |
| H02H 9/04 | (2006.01) |
| H01L 27/06 | (2006.01) |
| H01L 29/10 | (2006.01) |
| H01L 27/02 | (2006.01) |

(52) U.S. Cl.
CPC .... *H01L 21/76224* (2013.01); *H01L 27/0274* (2013.01); *H01L 27/0629* (2013.01); *H01L 29/1095* (2013.01); *H02H 9/04* (2013.01)

(58) Field of Classification Search
USPC .................................. 361/56; 257/355–360
See application file for complete search history.

(56) References Cited

U.S. PATENT DOCUMENTS

| | | | | |
|---|---|---|---|---|
| 4,906,904 A | * | 3/1990 | Tognoni | H03K 17/102 |
| | | | | 315/397 |
| 2008/0259511 A1 | | 10/2008 | Worley | |
| 2012/0176710 A1 | * | 7/2012 | Domanski | H01L 27/0285 |
| | | | | 361/56 |
| 2013/0215540 A1 | * | 8/2013 | Wang | H01L 27/0285 |
| | | | | 361/56 |
| 2013/0229736 A1 | * | 9/2013 | Van Der Borght | H02H 9/044 |
| | | | | 361/56 |
| 2014/0063665 A1 | * | 3/2014 | Chen | H02H 9/041 |
| | | | | 361/56 |

* cited by examiner

*Primary Examiner* — Danny Nguyen
(74) *Attorney, Agent, or Firm* — Horizon IP Pte. Ltd.

(57) ABSTRACT

Devices and methods of forming an integrated circuit (IC) that offer protection against ESD in high voltage (HV) circuit applications are disclosed. A device includes N ones of a field effect transistor (FET) stacked in series to provide an N-level stack, where N is an integer greater than 1. A first pad of the device is coupled to a first FET and a second pad is coupled to an Nth FET. The device also includes a stacked/distributed RC control circuit configured to cause a short circuit between the first pad and the second pad in response to an ESD event. During the ESD event, the RC control circuit is configured to concurrently provide sufficient voltage to control the N ones of the FET by turning them on using parasitic conduction to cause the short circuit.

21 Claims, 12 Drawing Sheets

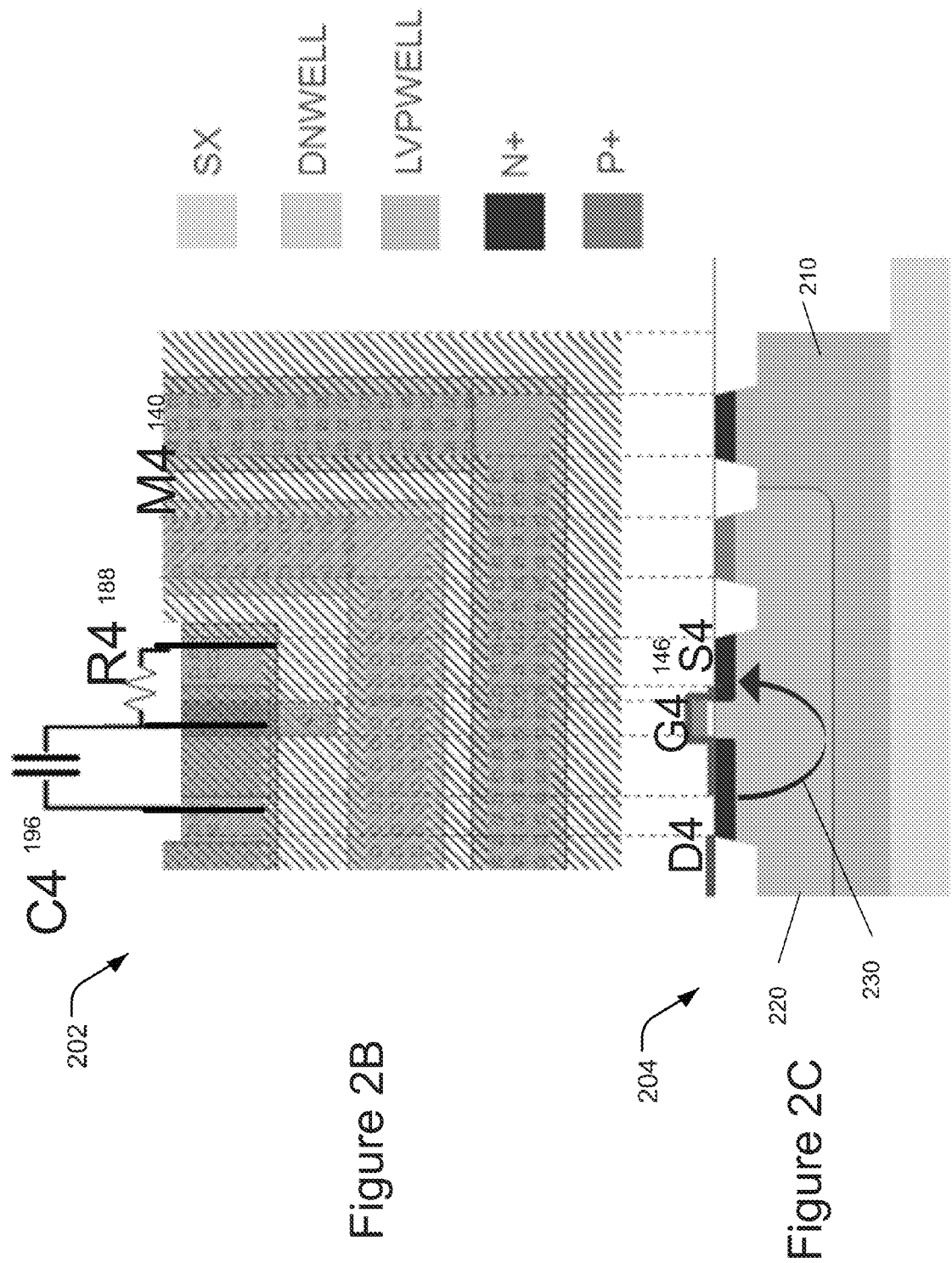

RC-STACKED MOSFET CIRCUIT FOR HIGH VOLTAGE (HV) ELECTROSTATIC DISCHARGE (ESD) PROTECTION

CROSS-REFERENCE TO RELATED APPLICATION

This Application claims the benefit of and priority to U.S. Provisional Patent Application No. 62/085,630, filed Nov. 30, 2014, which is hereby incorporated by reference in its entirety.

BACKGROUND

High voltage (HV) integrated circuits used in power management, power conversion, LCD/display, automotive and other applications typically operate between 52 V and 100 V. Stacked field effect transistor (FET) based cell structures are often used in the design of HV circuits. An occurrence of an electrostatic discharge (ESD) can severely and irreparably damage unprotected electronic circuits, including HV integrated circuits. As such, many HV integrated circuit chips may include a built-in ESD device to pro vide some measure of protection against the undesirable flow of damage-causing currents.

An ESD protection device in HV applications is typically prone to latch up errors since the FET operating voltages may exceed its design window (typically between supply voltage (VDD) and device breakdown voltage (BVDSS)). Stacking FET cell device (e.g., NMOS type) adds-up trigger voltage as well as the holding voltage by a factor N, where N is the number of devices being stacked. That is, although the stacking arrangement of N FET's has the potential to provide a total holding voltage of N times the holding voltage of each cell but it also provides a much higher trigger voltage (typically higher than BVDSS) which defeats the primary purpose of an ESD device since the protection feature is unable to be triggered before device breakdown.

From the foregoing discussion, it is desirable to provide tools and techniques to improve the robustness and reliability of ESD protection circuits in HV applications.

SUMMARY

Embodiments generally relate to device and method of forming an integrated circuit (IC) that offers protection against ESD in high voltage (HV) circuit applications are disclosed. A device includes N ones of a field effect transistor (FET) stacked in series to provide an N-level stack, where N is an integer greater than 1. A first pad of the device is coupled to a first FET and a second pad is coupled to an Nth FET. The device also includes a RC control circuit configured to cause a short circuit between the first pad and the second pad in response to an ESD event. The RC control circuit is configured to concurrently provide sufficient voltage to control the N ones of the FET to close in a sequential manner and cause the short circuit.

In another embodiment, a device includes N ones of a field effect transistor (FET) stacked in series to provide an N-level stack, where N is an integer greater than 1. A RC control circuit is operable to switch an operating state of each of the N ones of the FET from an open state to a closed state in response to an ESD event. The ESD event causes the RC control circuit to induce a base current in each of the N ones of the FET, thereby triggering parasitic conduction of the N ones of the FET in a cascaded manner.

In yet another embodiment, a method to protect a HV device in response to an ESD event is disclosed. The method includes stacking N ones of a field effect transistor (FET) in series to provide an N-level stack, where N is an integer greater than 1. A first pad is coupled to a first FET and a second pad is coupled to an Nth FET. A RC control circuit is configured to provide a short circuit between the first pad and the second pad in response to an ESD event, the short circuit being configured to discharge energy from the ESD event to the first pad. Parasitic conductance in the N ones of the FET is triggered by the ESD event, the parasitic conductance causing the N ones of the FET to close, thereby causing the short circuit.

In another embodiment, a method is presented. The method includes providing a substrate. Shallow trench isolation regions are formed in the substrate. The method also includes forming N-level RC stacked FET circuit with ESD protection. N ones of field effect transistor (FET) and resistors are formed in series on the substrate. A gate layer is provided over the substrate, and the gate layer is patterned to define gates of the FETs and resistors of the RC stacked FET circuit. The resistors are formed over the shallow trench isolation regions which isolate adjacent FETs. Capacitor structures are formed over the substrate. Interlevel dielectric (ILD) and intermetal dielectric (IMD) layers are formed over the substrate. Interconnects which include metal lines and via contacts are formed in the ILD and IMD layers. The interconnects couple the gates, capacitors and resistors to form the N-level RC stacked FET circuit.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 2B illustrates a layout view of a portion of an NMOS wafer to implement a single NMOS FET cell of a RC-stacked FET circuit with ESD protection described with reference to FIGS. 1A, 1B, 1C and 1D.

FIG. 2C illustrates a cross sectional view of a portion of an NMOS wafer to implement a single NMOSFET cell of a RC-stacked FET circuit with ESD protection described with reference to FIGS. 1A, 1B, 1C and 1D.

DETAILED DESCRIPTION

Figure 1A:
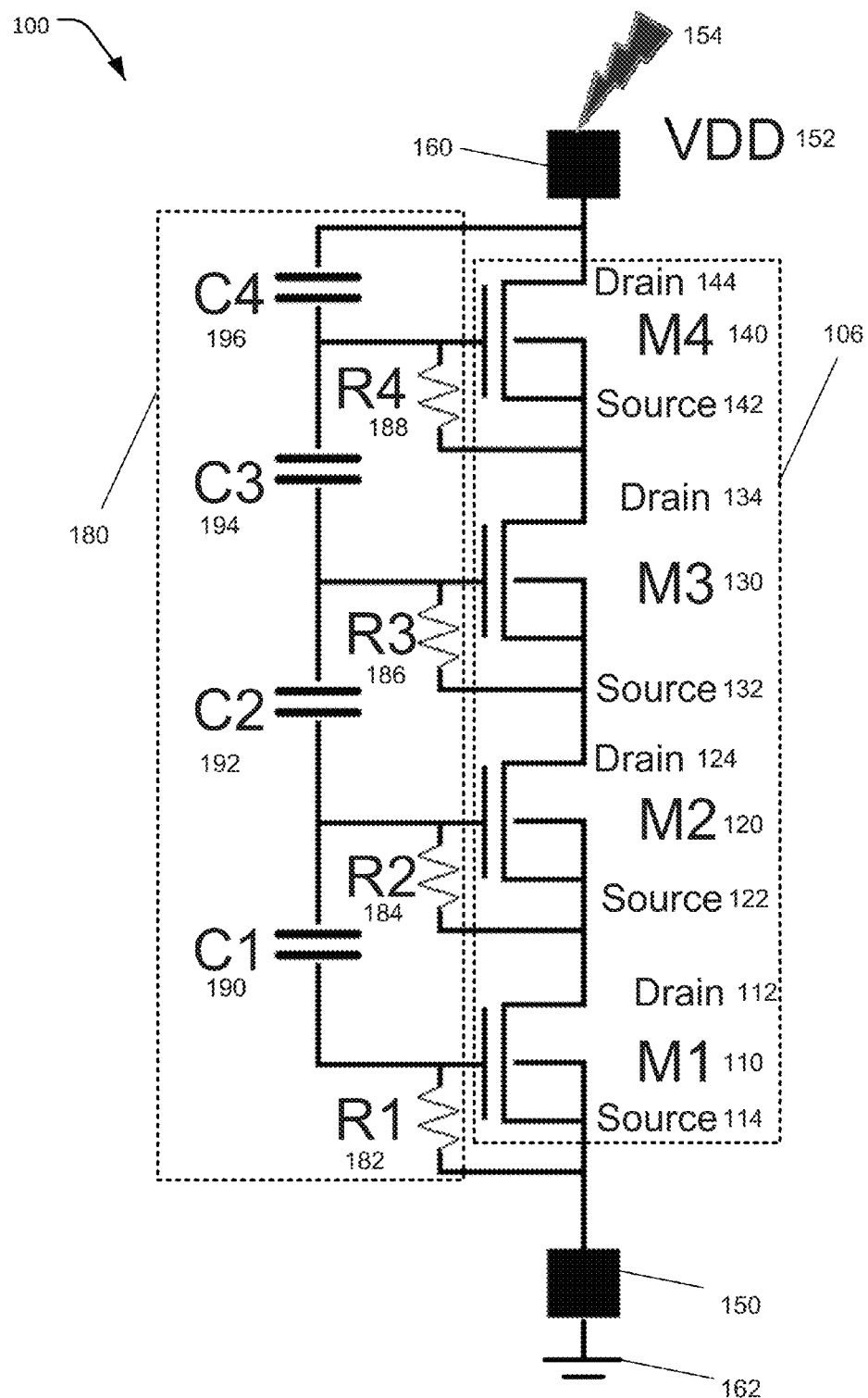
FIG. 1A shows a simplified circuit diagram of an embodiment of a portion of a RC-stacked FET circuit with ESD protection.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, and/or components for forming modules, sub-assemblies and assemblies assembled in accordance with a structure for an apparatus may be implemented using various materials and coupling techniques, depending on the application requirements.

Descriptive and directional terms used in the written description such as top, bottom, left, right, upstream, downstream, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Embodiments generally relate to devices, such as semiconductor devices or ICs. Other types of devices may also be useful. The devices can be any type of IC, such as chips for computing, power conversion, display, automotive and others. The devices can be incorporated into, for example, consumer electronic products, such as computers, monitors/displays, cell phones, wireless electronic devices like watches, cameras and printers, and several types of tablet computing devices. Incorporating the devices in other applications may also be useful.

Static electricity may be generated during everyday activities such as walking on a carpet or drying clothes made from synthetic fiber in a dryer thereby causing objects to have different electric potentials. Electrostatic discharge (ESD) is often described as a sudden and momentary flow of electric current (or energy) between two objects at different electrical potentials. In the context of electronic devices, ESD events may be described as momentary and undesirable spikes in current flow that may cause damage to electronic devices. In an ESD event, static electricity in the form of large voltage spikes or pulses may be transferred to a signal pad or a pin contact of an integrated circuit (IC), which may cause a breakdown of insulating layers within the IC. This may result in formation of short circuits between one or more conducting paths leading to the failure of the IC. In some cases, the ESD event may cause overheating of metal or even evaporation of material within the IC.

ESD Association is a well-known American National Standards Institute (ANSI) recognized standard development organization that has published over 35 ESD standards including Human Body Model (HBM), Machine Model (MM), Charged Device Model (CDM) and others that cover ESD in the electronics environment. Described below are various embodiments that provide an improved ESD protection to electronic devices while concurrently improving their HV applications.

Figure 1B:
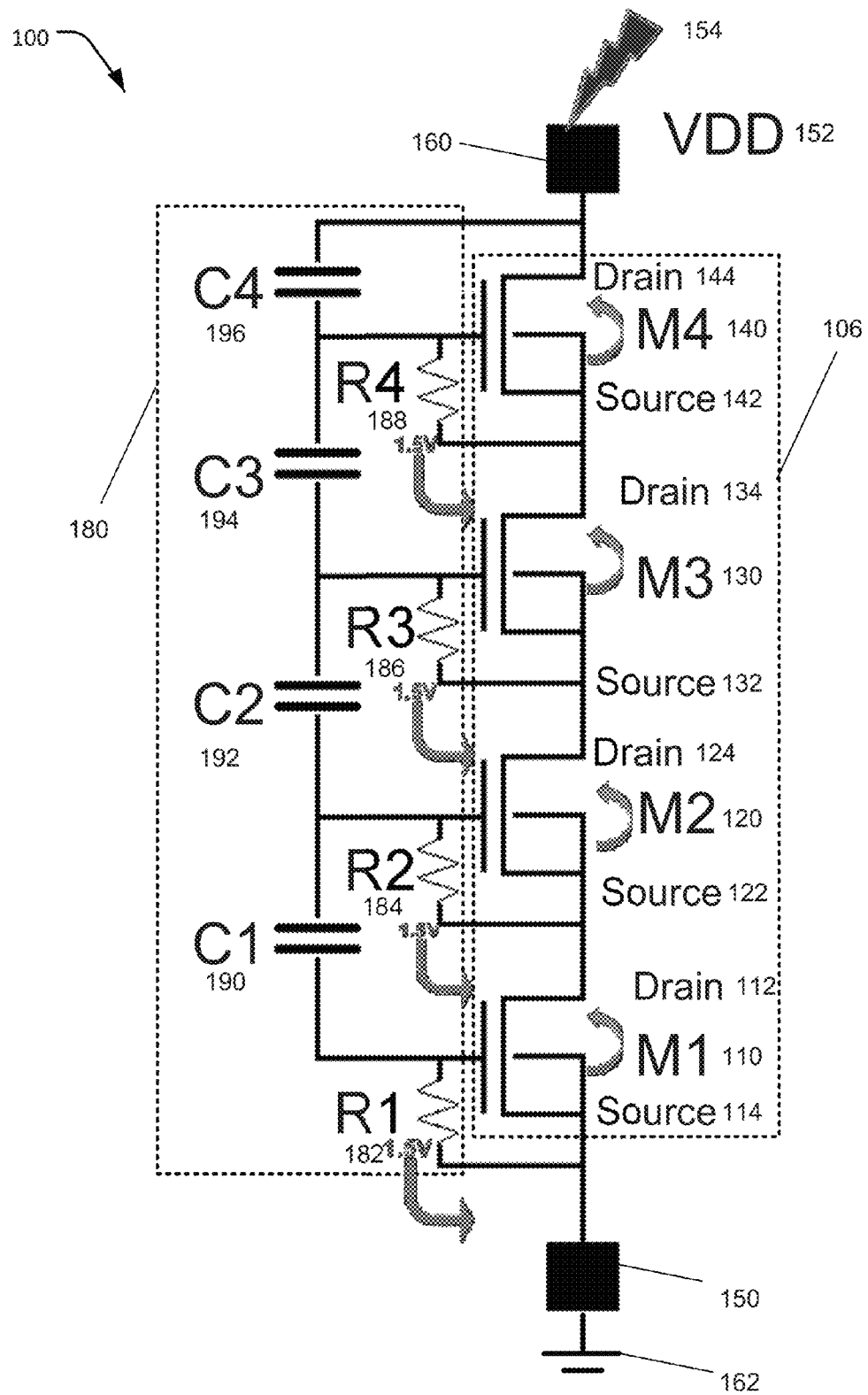
FIG. 1B illustrates a parasitic conduction induced turn on of each one of N NMOSFETs in a RC-stacked FET circuit, described with reference to FIG. 1A in a cascaded manner.
Figure 1C:
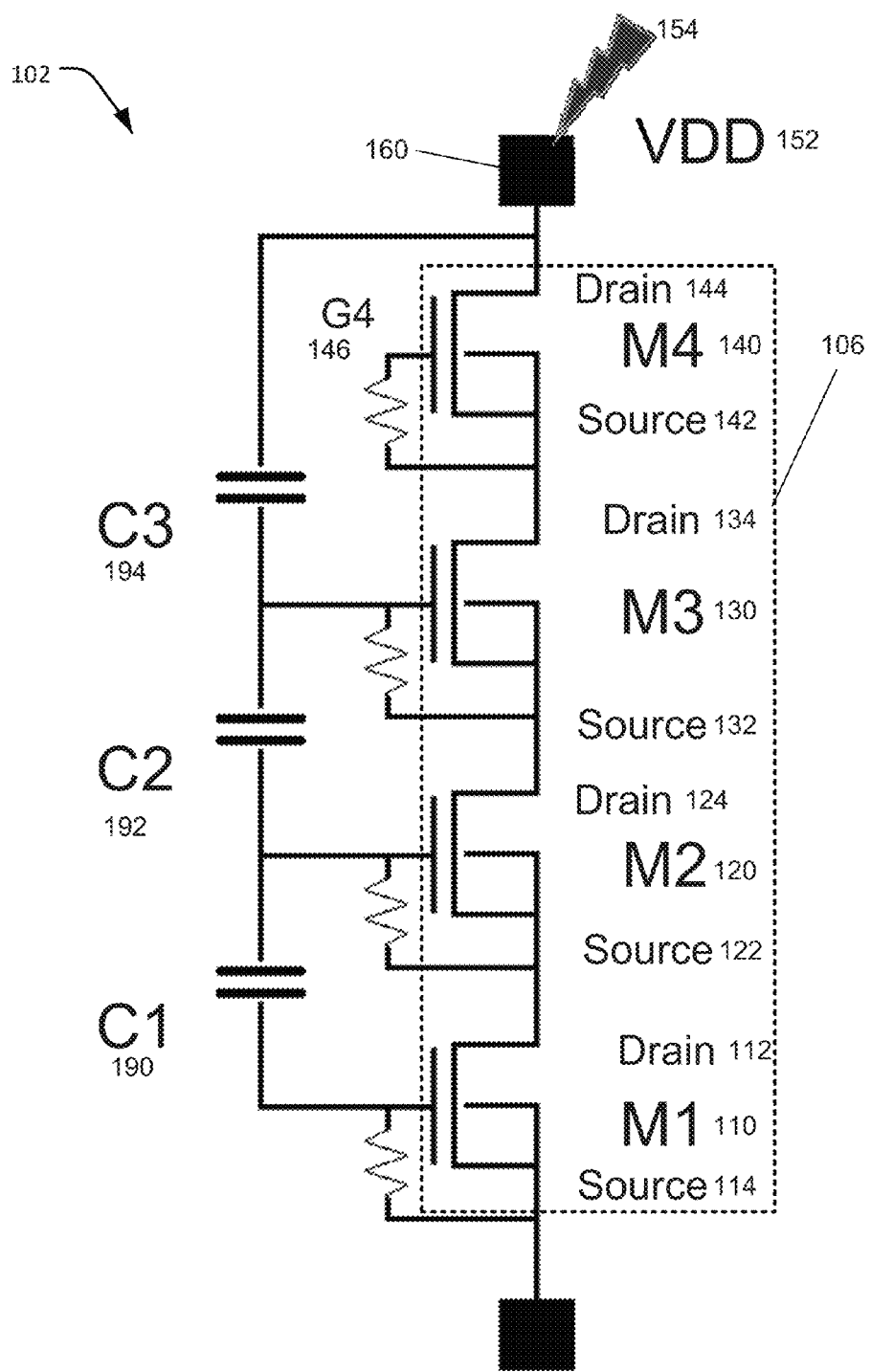
FIG. 1C shows a simplified circuit diagram of a portion of a RC-stacked FET circuit with ESD protection described with reference to FIG. 1A to provide a 25% reduction in a number of capacitors.
Figure 1D:
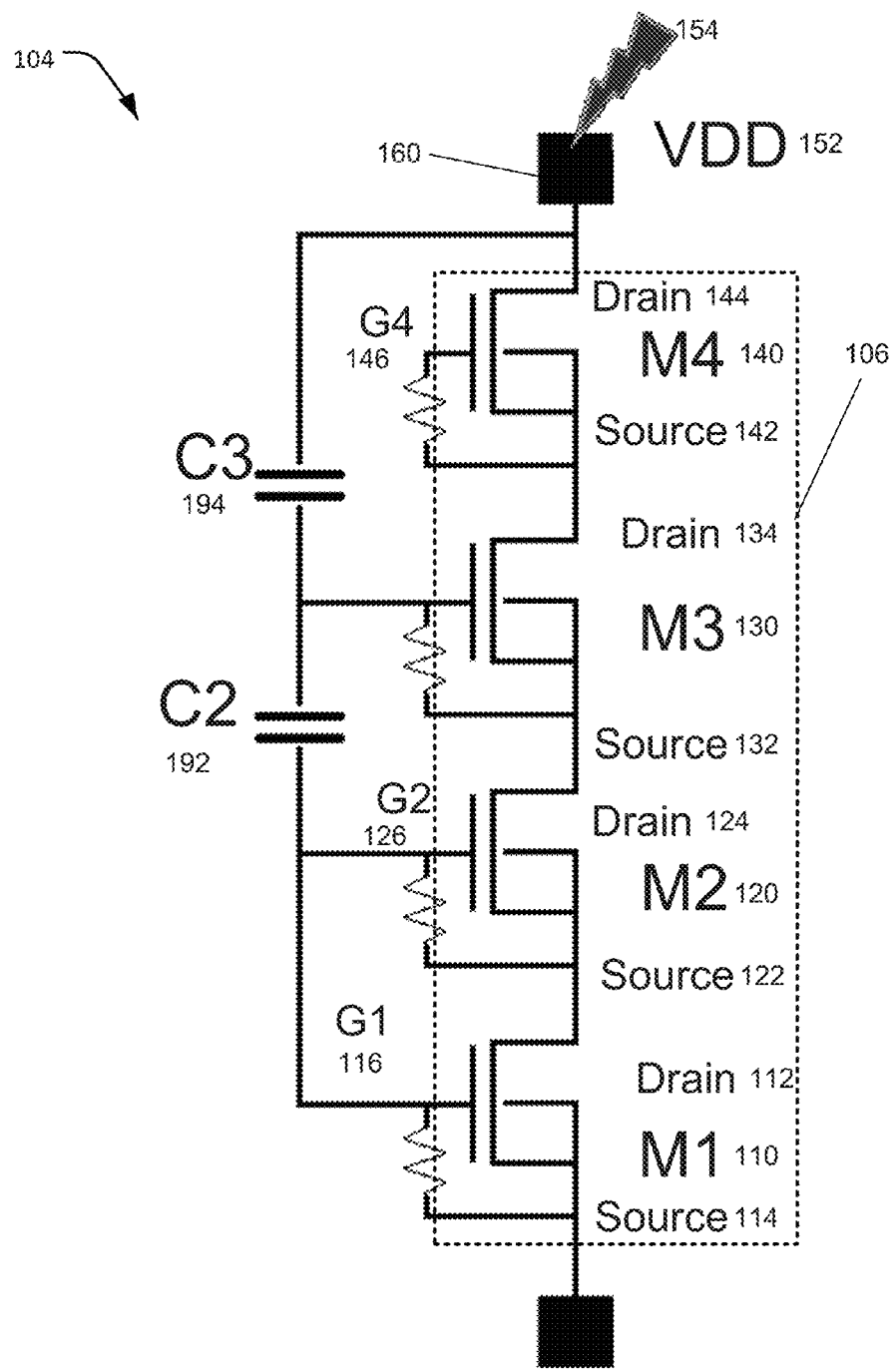
FIG. 1D shows a simplified circuit diagram of a portion of a RC-stacked FET circuit with ESD protection described with reference to FIG. 1A to provide a 50% reduction in the number of capacitors.

FIG. 1A shows a simplified circuit diagram of an embodiment of a portion of a RC-stacked FET circuit with ESD protection 100. FIG. 1B illustrates a parasitic conduction induced turn on of each one of the NMOSFETs in the RC-stacked FET circuit described with reference to FIG. 1A in a cascaded manner. FIG. 1C shows a simplified circuit diagram of a portion of a RC-stacked FET circuit with ESD protection 102 providing a 25% reduction in the number of capacitors. FIG. 1D shows a simplified circuit diagram of a portion of a RC-stacked FET circuit with ESD protection 104 providing a 50% reduction in the number of capacitors.

Referring to FIG. 1A, a portion of the RC-stacked FET circuit with ESD protection 100 includes N ones of a field effect transistor (FET) stacked in series to provide an N-level stack 106, wherein N is a integer greater than 1. In the depicted embodiment, the value of N is configured to be equal to 4. Other values of N are also contemplated, the selection being dependent on factors such as physical constraints of the electrical components including the voltage handling capacity of FET's and other RC devices. Thus, the N-level stack may be used in high voltage (HV) applications with ESD protection by increasing the voltage handling capability of the lower voltage baseline FET device by a factor of N. Although the depicted embodiment illustrates an NMOSFET implementation of a FET cell, it is understood that the FET cell may be implemented as any MOSFET device.

In the depicted embodiment, the 4-level stack includes 4 NMOSFET's M1 110, M2 120, M3 130 and M4 140 that are coupled in series (e.g., output of one FET is connected to an input, of next FET). That is, drain D1 112 of M1 is coupled to a source S2 and bulk/body 122 of M2, drain D2 124 of M2 is coupled to a source S3 and bulk/body 132 of M3, drain D3 134 of M3 is coupled to a source S4 and bulk/body 142 of M4. The second pad 160 is coupled to a power source VDD 152 and the drain D4 144 of M4 140. A source S1 and bulk/body 114 of M1 is coupled to the first pad 150, which may be connected to a reference voltage 162 such as ground.

The RC-stacked FET circuit with ESD protection 100 also includes a RC control circuit 180 configured to cause a short circuit (or shunt) between the first pad 150 and the second pad 160 in response to an ESD event 154 in which ESD energy is transferred to the second pad 160. The RC control circuit 180 is also configured to provide a high impedance between the first pad 150 and the second pad 160 in a normal operating state (e.g., in absence of the ESD event) of the RC-stacked FET circuit 100. In an embodiment, the RC control circuit 180 is operable to switch an operating state of each of the N ones of the FET from an open (or off or de-asserted) state to a closed (or on or asserted) state in response to the ESD event.

The RC control circuit 180 controls an impedance of a path between the first pad 150 and the second pad 160 to a low value (e.g., short circuit) by switching the 4 NMOSFET's M1 110, M2 120, M3 130 and M4 140 to an on (or closed or asserted) state by using parasitic conduction, which may be triggered by turning on a parasitic NPN BJT inherently present in the NMOSFET. The triggering may occur at a predetermined drain-source voltage (VDS) of each MOSFET by a gate potential inducing substrate current and not by active turn on of the NMOSFET. Thus, the ESD event causes the RC control circuit to induce a small potential at each gate of each stacked NMOSFET cell that in return induces a base current in parasitic NPN BJT's that are inherently present in each of the N ones of the FET, thereby triggering parasitic conduction of the N ones of the FET in a cascaded manner. Additional details of turning on the NMOSFET's using parasitic conduction in a cascaded manner is described with reference to FIGS. 2C and 3.

In the depicted embodiment, the RC control circuit 180 includes 4 capacitors (C1 190, C2 192, C3 594, C4 196) coupled in series between the second pad 160 and gate G1 of M1 110 and 4 resistors (R1 182, R2 184, R3 186 and R4 188) coupled between the gate and the source of each corresponding NMOSFET cell. Thus, an RC combination (e.g., C4/R4, C3/R3, C2/R2 and C1/R1) is coupled to a corresponding NMOSFET cell (e.g., M4, M3, M2 and M1) of the 4-level stack of 4 NMOSFETs respectively.

In an embodiment, all resistors (R1 182, R2 184, R3 186 and R4 188) may be configured to be equal in value. In one HV application, depending on the type and value of capacitors configured, a value of the resistance may be selected to be equal to 80 kΩ. Additional details of performing SPICE simulation to configure R and C values and display simulated performance of the RC-stacked FET circuit 100 in response to the ESD event is described with reference to FIG. 4A.

In response to fast rise time of an ESD signal, the RC control circuit 180 provides a uniform voltage division across the 4-level NMOSFET stack for static (e.g., off state) and dynamic (e.g., on state) protection from an ESD event. That is, in response to fast rise time of an ESD signal, the RC control circuit 180 provides sufficient voltage to the gate of an NMOSFET cell so that the VGS voltage is below a trigger/turn-on level to remain in the off state and at least equal to the trigger/turn-on level to trigger parasitic conduction to be switched to the on or closed state. The gate voltage seen by each NMOSFET cell to turn it on is well below its breakdown voltage.

In the normal operating state of the RC-stacked FET circuit 100, voltage at the second pad is VDD. In an embodiment, if VDD=30V DC, then the drain of each stack MOSFET will be equally and uniformly distributed to approximately 30 VDC divided by 4, or 7.5V DC (M1 drain), 15V DC (M2 drain), 22.5V DC (M3 drain) and 30V DC (M4 drain). The gate voltage VG (and not VGS) of each MOSFET will also be roughly 30 VDC divided by 4, which is the same as the drain voltage. Since M1 drain is coupled to M2 source, source potentials at each NMOSFET may also be determined.

In the normal operating state, the gate voltage of each NMOSFET cell is controlled to be less than the trigger voltage for parasitic conduction in order to maintain the 4 NMOSFETs in an 'off' state. For example, the voltage is divided equally across each NMOSFET device and through the gate coupling resistor (R1 182, R2 184, R3 186 and R4 188) to cause each of the gate potential to be the same as the source potential. As such, each of the NMOSFET gate to source (VGS) potential is zero and is in the off-state. The configured value of the resistor determines the RC constant. For example, the configured value determines the rise time response (1/RC) of the RC control circuit.

In response to an ESD event 154, the gate-source voltage (VGS) required to trigger and turn on each NMOSFET may be configured by setting a value of the inserted resistors (e.g., R1 182, R2 184, R3 186 and R4 188) and capacitors (e.g., C1 190, C2 192, C3 194, C4 196) and parasitic BJT capacitance using SPICE simulation. Therefore, rather than relying solely on the parasitic capacitance, a capacitor of known value may be used so that the variation of the parasitic capacitance may not significantly alter the total capacitance. Furthermore, internal parasitic capacitance may not be sufficiently large to determine the design intended specific RC constant for each NMOSFET cell to gate induce substrate current. As the stack size increases, each capacitor in the stack supports a larger voltage, however the voltage rating of the capacitors may be limited by the dielectric used between the capacitor plates. The voltage rating of the capacitor, which may also depend on the technology and the type of capacitor device used, should be configured to be greater than BVDSS of a single cell NMOS. In response to energy from the ESD event being shunted to ground, the RC-stacked FET circuit with ESD protection 100 exits the parasitic conduction mode and returns to the normal mode of operation. Thus the RC-stacked FET circuit 100 provides an optimum operating window for an ESD device to work as a latch-up free device since it has a high holding voltage (higher than VDD) while its triggering voltage is lower than BVDSS.

In absence of an ESD event (e.g., during normal operation in an off state), a value of resistors (e.g., R1 182, R2 184, R3 186 and R4 188) and capacitors (e.g., C1 190, C2 192, C3 194, C4 196) is configured so that these components have minimal impact on the operation of the RC-stacked FET circuit 100 by ensuring that the gate of each NMOSFET is less than the trigger/turn-on voltage and provide sufficient voltage to the gate during an ESD event such that the parasitic conduction is triggered to turn on the NMOSFET. Thus, the RC control circuit functions in response to fast ramp signal such as ESD signal (e.g., HBM with ~10/2 ns rise time, and CDM with ~1 ns). The RC control circuit will hold stack voltage potential in absence of ESD signals.

Although the depicted embodiment illustrates an NMOSFET circuit, it is understood that the RC-stacked FET circuit, with ESD protection 100 may be implemented using PMOSFETs. It is contemplated that, the RC-stacked FET circuit 100 may also use additional types of transistor technologies (e.g., laterally diffused MOSFET (LDMOS), drain extended MOS (DEMOS), and others) to match HV ESD application requirements.

Thus, the RC control circuit 180 provides non-snapback ESD protection for the 4-stack MOSFETs since the FET operating voltages are maintained within its design window (typically between supply voltage (VDD) and device breakdown voltage (BVDSS)). Secondly, the RC control circuit 180 may be tailored to provide ESD HV solution for different operating voltage (e.g., by configuring N=2, 3, or 4 for a 2-stack, 3-stack, or 4-stack MOSFETs respectively). Scalable on-resistance (RON) and current limits may be configured for each individual MOSFET size being stacked, e.g., by configuring finger width and number of fingers. Fabrication of RC-stacked FET circuit 100 uses similar process as MOSFET and uses no additional process mask. Additional details of fabrication of a RC-stacked FET circuit described with reference to FIGS. 1A, 1B, 1C and 1D are described with reference to FIGS. 2A, 2B, 2C, 2D and 2E. In the NMOS/FET being stacked, SBLK may be configured at the drain side as described with reference to FIG. 4B or fully SBLK both Drain-Source. SBLK may be acting as ballasting resistor against the high field stress to the FET. This configuration may be viewed as a single SBLK FET implemented as an ESD device. Non-SBLK may be used in an implementation, however this may increase the chip size (NF>8/10).

Referring to FIG. 1B, a parasitic conduction induced NMOSFET turn on in a cascaded manner of each one of the NMOSFETs in the RC-stacked FET circuit 100 described with reference to FIG. 1A is illustrated. In response to the ESD event 154, the capacitances (e.g., C1 190, C2 192, C3 194, C4 196) behave as a short circuit (due to rise time signal). Resistance R1 raises the potential of the gate oxide. Both drain and gate potential of each NMOSFET may be raised but at a different rate, which eventually creates a potential difference between each gate and source (VGS). The gate voltage at M1 NMOSFET increases above threshold for parasitic conduction (e.g., about 1.5V to 2V) causing M1 to close. The threshold of gate induce substrate peak current, for example, may depend on the technology node, such as process condition, gate thickness, well/body, as well as other factors. Additional details of a graph that shows the substrate current peaking at VGS value of approximately 1.5 V is described with reference to FIG. 3. Referring back to FIG. 1B, when M1 is closed, gate of M2 is now coupled to ground via R2 and gate voltage at M2 increases to be above threshold/turn-on causing M2 to close. When M2 is closed, gate of M3 is now coupled to ground via R3 and gate voltage at M3 increases to be above threshold/turn-on causing M3 to close. When M3 is closed, gate of M4 is now coupled to ground via R4 and gate voltage at M4 increases to be above threshold/turn-on causing M4 to close. Closing of M4 establishes a short circuit path to conduct ESD current. Hence, the RC-stacked FET circuit 100 provides a parasitic NPN turn-on of the 4 NMOSFETs in a cascaded manner (e.g., M1, then M2, then M3 and finally M4). The parasitic conduction occurs at a predetermined drain-source potential of each stacked MOSFET by substrate current induced by gate potential.

In an embodiment, in response to an ESD event 154, all NMOSFETs M1, M2, M3 and M4 may be closed (or turned on due to parasitic conduction) simultaneously and concurrently. That is, a sequence of closing may occur in a random manner. However, all NMOSFETs M1, M2, M3 and M4 need to be closed (e.g., placed in an on state) to establish the short circuit path to the first pad 150. Additional details describing various graphs to illustrate the ESD performance of the RC-stacked FET circuit 100 in response to the ESD event is described with reference to FIGS. 3, 4A and 4B.

Referring FIG. 1C, a simplified circuit diagram of a portion of a RC-stacked FET circuit 102 used for HV ESD protection is illustrated with a 25% reduction in the number of capacitors. In the depicted embodiment, the RC-stacked FET circuit 102 operation is similar to the RC-stacked FET circuit 100 described with reference to FIG. 1B except for the number of capacitors (e.g., capacitor C4 196 described with reference to FIG. 1A may be eliminated) to reduce the number of capacitors by 25% and achieve a corresponding reduction in the chip area. In the depicted embodiment, gate G4 146 of M4 is not directly coupled to any capacitor. Since each capacitor in the stack supports a larger voltage across it, the voltage rating of the 3 capacitors which is limited by the dielectric used between the capacitor plates may limit the size of the stack.

Referring FIG. 1D, a simplified circuit diagram of a portion of a RC-stacked FET circuit 104 used for HV ESD protection is illustrated with a 50% reduction in the number of capacitors. In the depicted embodiment, the RC-stacked FET circuit 104 operation is similar to the RC-stacked FET circuit 100 described with reference to FIG. 1B except for the number of capacitors (e.g., a configurable number of capacitors such as capacitors C1 190 and C4 196 may be eliminated) to reduce the number of capacitors by 50% and achieve a corresponding reduction in the chip area. In the depicted embodiment, gates G4 146 of M4 is not directly coupled to any capacitor and gate G1 116 of M1 and gate G2 126 of M2 are directly coupled to C2 capacitor. Since each capacitor in the stack supports a larger voltage across it, the voltage rating of the 2 capacitors which is limited by the dielectric used between the capacitor plates may limit the size of the stack.

Figure 2A:
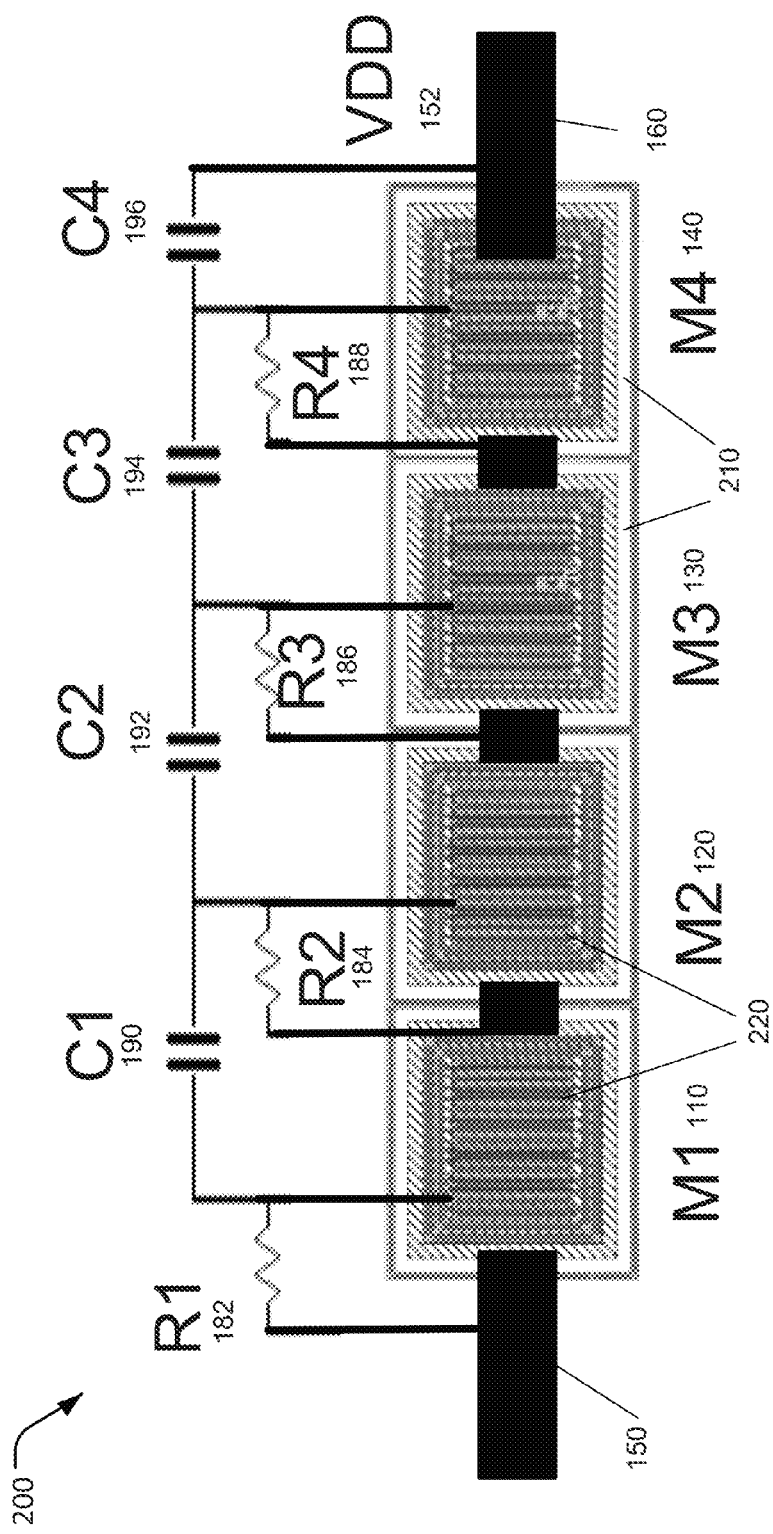
FIG. 2A illustrates a layout view of a 4-stacked multifinger drain silicide blocked (SBLK) NMOS as a HV ESD protection circuit described with reference to FIG. 1A.

Referring to FIG. 2A, it is a layout view of a portion of a NMOS wafer 200 to implement a RC-stacked FET circuit with ESD protection described with reference to FIG. 1. Each one of the NMOSFET's M1 110, M2 120, M3 130 and M4 140 is fabricated inside an independent isolation deep N-well (DNWELL) 210. In the depicted embodiment, the RC control circuit 180 described with reference to FIG. 1A, includes 4 capacitors (C1 190, C2 192, C3 194, C4 196) coupled in series between the second pad 160 and gate G1 of M1 110 and 4 resistors (R1 582, R2 184, R3 186 and R4 188) coupled between the gate and the source of each NMOSFET cell.

The RC combination (e.g., C4/R4, C3/R3, C2/R2 and C1/R1) is coupled to a corresponding NMOSFET cell (e.g., M4, M3, M2 and M1) of the 4-level stack of 4 NMOSFETs respectively. Resistance R1 and source S1 of M1 are coupled to the first pad 150 and capacitor C1 is connected between second pad 160 and gate G4 of M4. As described earlier, each RC combination (e.g., C4/R4, C3/R3, C2/R2 and C1/R1) gives enough potential during the ESD event 154 to trigger its NMOSFET's cell parasitic NPN bipolar transistor. Hence, triggering is controlled by RC control circuit 180 to trigger parasitic conduction and not by an avalanche breakdown of each NMOSFET's N+/Pwell cell.

In an embodiment, each NMOSFET cell may include a plurality of fingers 220 to handle large ESD currents. In the depicted embodiment, each NMOSFET cell may be configured to include 8 fingers.

Resistors (R1 182, R2 184, R3 186 and R4 188) may be fabricated from known resistor types such as polysilicon, diffusion, and others, depending on application factors such as available surface area, desired accuracy, and others. Poly resistors may include silicided poly resistors, non-silicided poly resistors, unsalicided poly resistors, unsalicided poly-metal resistors, salicided poly resistors, and salicided poly-metal resistors. Similarly, capacitors (C1 190, C2 192, C3 194, C4 196) may be fabricated from known capacitor types such as metal insulator metal (MIM) capacitor, well capacitor, poly capacitor, alternate polarity metal-oxide-metal (AP- MOM) capacitors, and capacitors formed between poly layer and Nwell layer (Poly Nwell Capacitor). Other resistor and capacitor types may also be useful.

Referring to FIG. 2B, it is a layout view of a portion of an NMOS wafer 202 to implement a single SBLK NMOSFET cell of the RC-stacked FET circuit with ESD protection described with reference to FIG. 1A. Referring to FIG. 2C, it is a cross sectional view of a portion of an NMOS wafer 204 to implement a single NMOSFET cell of the RC-stacked FET circuit with ESD protection described with reference to FIG. 1A.

Referring to FIGS. 2B and 2C, the single NMOSFET M4 140 (with Drain SBLK) is illustrated in the depicted embodiment. Capacitor C4 is coupled between the second pad 160 and gate G4 146 of M4 and resistor R4 is coupled between the gate G4 and source S4 and bulk/body of 144 of M4. NMOSFET M4 140 is fabricated inside an independent isolation deep N-well (DNWELL). A moderately doped P region 220 (LVPWELL) is used for low voltage devices. When a voltage VGS at gate G1 of M1 110 is increased to be at least equal to the threshold voltage it induces a substrate current ISUB peak 230 to trigger parasitic NPN bipolar transistor inherently present in M1. Additional details of the induced current versus VGS are described with reference to FIG. 3. Referring to FIGS. 2B and 2C, when this triggering occurs, the weak surface conduction of the NMOSFET cell switches to bipolar conduction through bulk substrate. Drain D1 becomes a collector, p-substrate becomes a base, and source S1 becomes an emitter to form the parasitic NPN bipolar transistor.

When the NMOSFET operates in the parasitic NPN bipolar conduction region, M1 110 is closed and the lateral NPN bipolar conducts most of the drain terminal current. Hence, the trigger mechanism to operate the 4 NMOSFETs may be advantageously switched from traditional use of higher voltage condition to create an avalanche junction breakdown of each NMOSFET cell to a much smaller voltage level to trigger a bipolar parasitic NPN transistor operation in each NMOSFET cell in a cascaded manner. It may be recalled that trigger voltage for an avalanche breakdown of a 4-level stack is about 4× that of a single NMOSFET cell.

Thus, each NMOSFET cell is controlled (e.g., turned on or closed) by using parasitic conduction and not by an active turn on of the MOSFET device (e.g., by raising gate potential to create an inversion channel) since active turn on current is minimal. Additionally, use of active turn on technique for the NMOSFETs may require 10-40× the size of parasitic conduction based technique, and use of active turn on may not provide high holding voltage and its activation and trigger mechanism may be solely determined by RC value time constant, which may be much higher (e.g., ~1 μsec) to cover the ESD event. Additional details of the graphs are described with reference to FIGS. 4A and 4B.

Figure 2D:
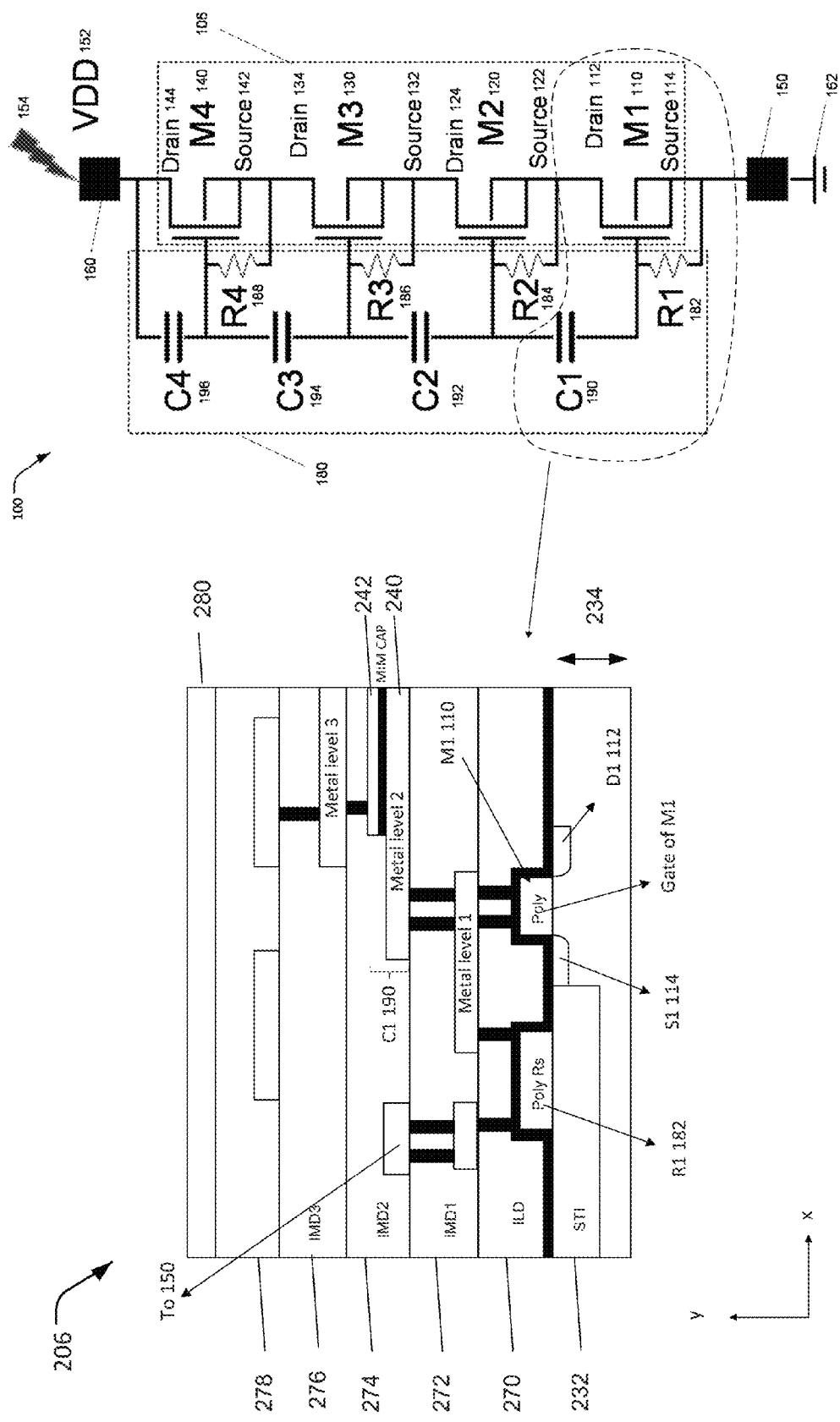
FIG. 2D illustrates a cross sectional view of a portion of an NMOS wafer to implement a single NMOSFET cell of a RC-stacked FET circuit with ESD protection described with reference to FIG. 1A.

FIG. 2D illustrates a cross sectional view 206 of a portion of an NMOS wafer to implement a single NMOSFET cell of a RC-stacked FET circuit with ESD protection described with reference to FIG. 1A. The cross sectional view 206 illustrates structure of a single, simplified NMOSFET cell that includes M1 110, R1 182, C1 190. In an embodiment, the NMOSFET cell may be fabricated on a common p-type substrate 234 (wafer). Shallow Trench Isolation (STI) 232 provides electrical isolation between other NMOSFET cell devices. Metal and contacts provide access to the M1 110 device terminals S1 114, D1 112, and gate G1. Multiple levels of metal lines may be routed to interconnect the devices to the second pad 160 to form a portion of the circuit 100 on a chip. In the depicted embodiment, the interconnect structure includes 1 Inter-Layer Dielectric (ILD) ILD 270, 3 Inter-Metal Dielectric (IMD) layers IMD1 272, IMD2 274 and IMD3 276. Other passivation layers such as oxide passivation layer 278 may also be included. C1 190 may be implemented as a MIM capacitor that includes a top plate 242 and a bottom pate 240 formed in the IMD2 274 layer. A surface dielectric layer 280 may be a silicon-containing dielectric layer, which may include silicon oxide (SiO2), silicon oxynitride (SiON), silicon nitride (SiN), or other materials.

Forming the single, simplified NMOSFET cell that includes M1 110, R1 182, C1 190 described with reference to FIG. 1A may include preparing a p-type substrate. After shallow trench isolation (STI) formed, a thin layer of polysilicon is deposited on top of gate dielectric (mostly silicon oxide) to form gate electrode and poly resistor. With subsequent process like dielectric spacer, source/drain implant and silicide formation, transistor is formed with source/drain electrode also. Then come to the back-end process like contact, metal-1, via-1, and metal-2. In this case, metal-2 serves as bottom plate of MIMCAP. Therefore after metal-2 deposition, a layer of MIMCAP dielectric (mostly silicon nitride) and MIMCAP top plate (mostly TaN) are deposited and etched. After that, via-2 will connect bottom plate (metal-2) and top plate (TaN) to separate metal-3 to form the MIMCAP electrode. Then the wafer will go through the rest of back-end process like via-3, metal-top and PAD to finish the processing.

Figure 2E:
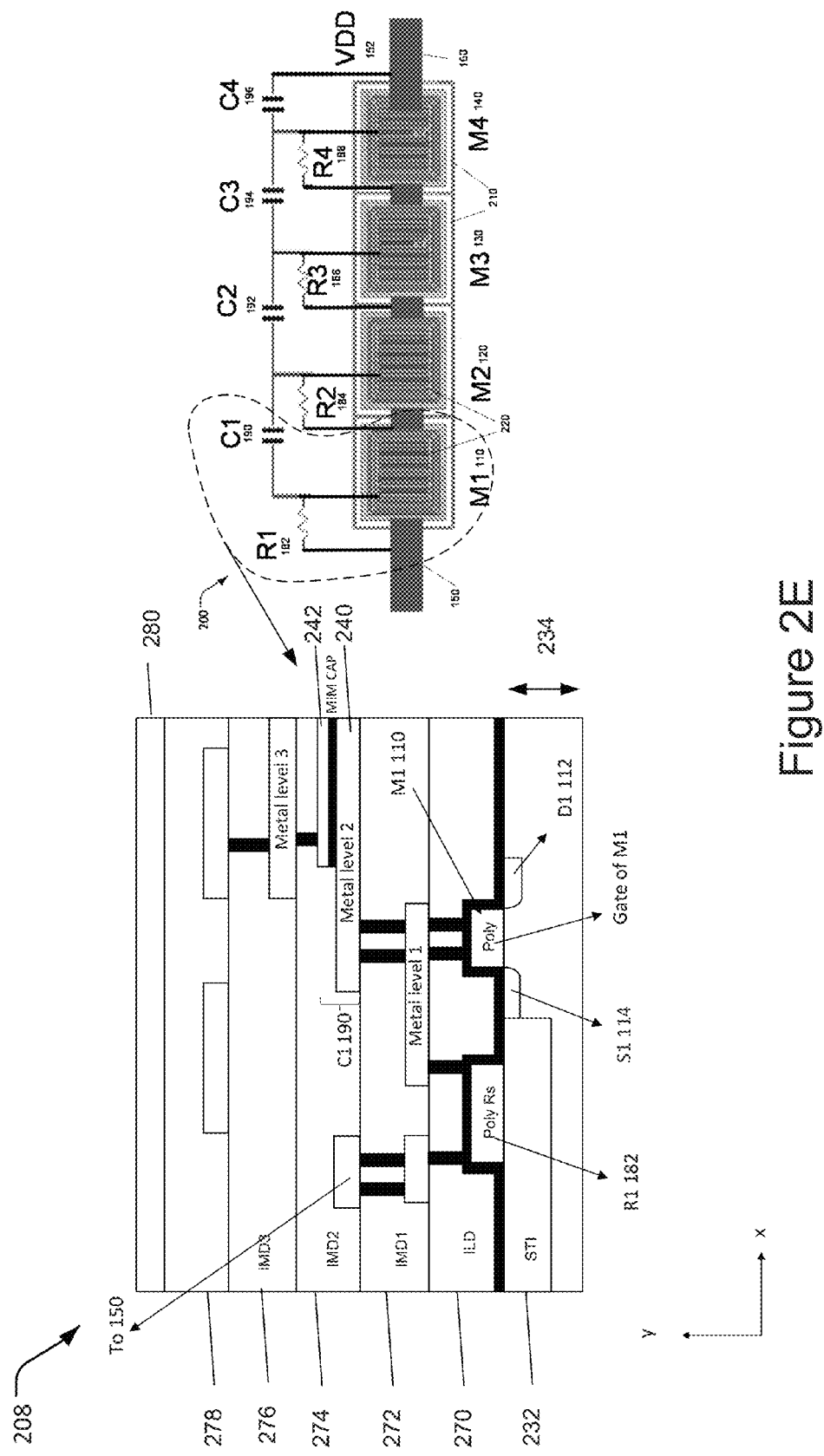
FIG. 2E illustrates a cross sectional view of a portion of an NMOS wafer to implement a single NMOSFET cell of a RC-stacked FET circuit with ESD protection described with reference to FIG. 2A.

FIG. 2E illustrates a cross sectional view 208 of a portion of an NMOS wafer to implement a single NMOSFET cell of a RC-stacked FET circuit with ESD protection described with reference to FIG. 2A. The cross sectional view 208 illustrates structure of a single, simplified NMOSFET cell that includes M1 110, R1 182, C1 190. The cross sectional view may be reproduced 3 times for M2 120, M3 130 and M4 140 and arranged in an adjacent or side-by-side manner along the same axis (e.g., X-axis) for a coplanar implementation of the 4 level RC stacked FET circuit. In an embodiment, the NMOSFET cell may be fabricated on a common p-type substrate (wafer). Shallow Trench Isolation (STI) provides electrical isolation between other NMOSFET cell devices. Metal and contacts provide access to the M1 device terminals S1 114, D 112, and gate G1. Multiple levels of metal lines may be routed to interconnect the devices to the second pad 160 to form a portion of the circuit 100 on a chip. In the depicted embodiment, the interconnect structure includes 5 Inter-Layer Dielectric (ILD) ILD 270, 3 Inter-Metal Dielectric (IMD) layers IMD1 272, IMD2 274 and IMD3 276. Other passivation layers such as oxide passivation layer 278 may also be included. C1 190 may be implemented as a MIM capacitor that includes a top plate 242 and a bottom pate 240 formed in the IMD2 274 layer. A surface dielectric layer 280 may be a silicon-containing dielectric layer, which may include silicon oxide (SiO2), silicon oxynitride (SiON), silicon nitride (SiN), or other materials.

In an embodiment, forming the single, simplified NMOSFET cell that includes M1 110, R1 182, C1 190 described with reference to FIG. 2A is similar to the process described in FIG. 2E.

Figure 3:
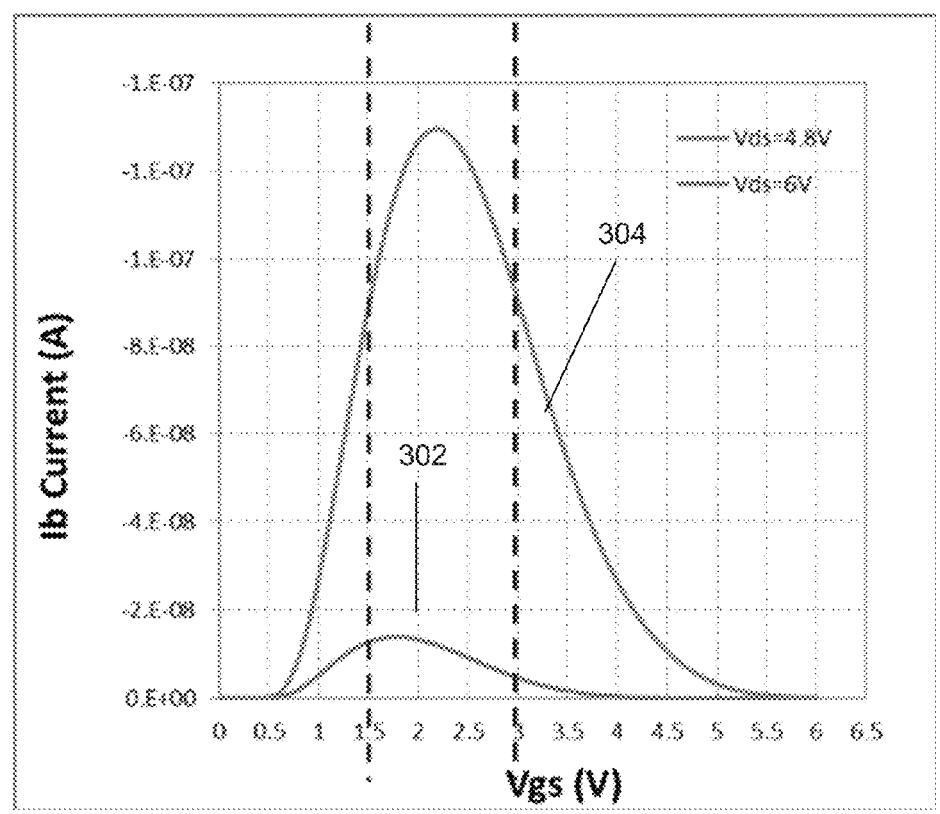
FIG. 3 illustrates in graphical form silicon data plot of a base current Ib (Y-axis) as a function of VGS (X-axis) for a NMOSFET device implemented using commercially available BCD process technology.

FIG. 3 illustrates in graphical form a simulated plot 300 of a base current Ib (Y-axis) as a function of VGS (X-axis) for a 6V NMOSFET device implemented in a commercially available 0.18 μm Bi-polar-CMOS-DMOS (BCD) process technology. ISUB is a function of VGS and YDS. Two base currents graphs 302 and 304 are shown corresponding to 2 predetermined values of YDS. The graphs 302 and 304 illustrate that the base current Ib increases substantially in response to the YDS increasing from 4.8 V to 6 V. In response to the ESD event, a voltage VGS at gate G1 of M1 110 is increased above the trigger voltage (e.g., 1.5 V to 2 V for the 6 V NMOSFET) that is sufficient to induce a substrate current ISUB peak. This triggers a parasitic NPN BJT inherently present in M1 at a configurable drain-source potential, e.g., 8 V and hold the parasitic conduction mode with a holding voltage of about 7 to 7.5 V. Thus, by configuring values of capacitances, the parasitic NPN BJT of each MOSFET may be configured to turn on at specific drain-source potential, e.g., 8V and clamp/hold the NMOSFETS in the parasitic conduction state during the ESD event by the capability of parasitic NPN MOSFET holding voltage of approximately 7 V to 7.5 V.

Figure 4A:
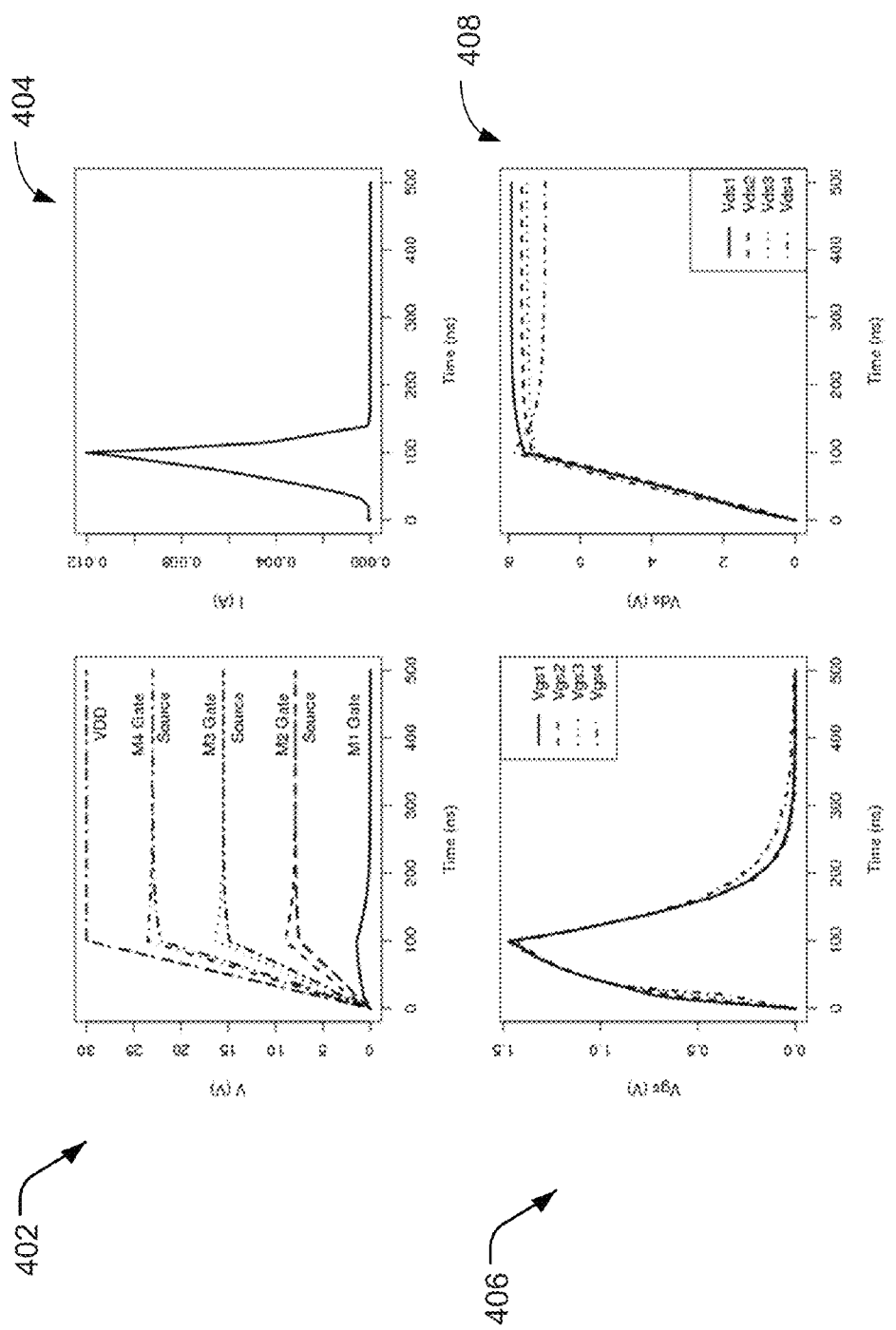
FIG. 4A illustrates in graphical form simulated transient as well as DC sweep performance of a 4 RC-stacked SBLK NMOS.

FIG. 4A illustrates in graphical form simulated plots of an ESD performance of a RC-stacked FET circuit described with reference to FIG. 1A. As described earlier, each cell of the 4-layer stack may be fabricated as a 6V NMOSFET device using commercially available 0.18 μm BCD process technology. SPICE simulations may be performed for determining response to the ESD event and for verifying performance and operation of the RC-stacked FET circuit described with reference to FIG. 1A. SPICE simulation described with reference to FIG. 4A may also be used to configure a value of each capacitor for different configurations described with reference to FIGS. 1A, 1B, 1C, and 1D.

Simulated plot 402 illustrates distribution of the gate and drain voltages of a 4-layer NMOSFET stack as a function of time. As the ESD signal ramps up from 0 to 30V in 100 ns, potential at each gate node and source node of the 4 NMOSFETs are shown. The VGS for individual MOSFET is M1/2/3/4 gate voltage less source voltage (the drain of each MOSFET is coupled to the source of the upper MOSFET in the stack).

Value of VGS depends on the operating state of the circuit. The circuit is on VDD active, say VDD=30V DC, each of the drain of each stack MOSFET will be roughly (30/4), 7.5V DC (M1drain), 15V DC (M2drain), 22.5V DC (M3drain) and 30V DC (M4drain), VG potential at, the gate (note: gate VG, not, gate-source VGS) of each MOSFET will be roughly 30/4 distributed equally and is the same as the drain and the operating state of the NMOSFET is off or open.

In response to the ESD, both drain and gate voltages will be increased but at different slopes (or dv/dt rate) to generate a voltage difference. The voltage difference between each gate and source may be sufficient enough to induce substrate current and enough to trigger parasitic NPN bipolar transistor of each MOSFET. The flow of current due to parasitic conduction in each NMOSFET turns it on, which provides the short circuit to the ground.

Simulated plot 404 illustrates current flowing through RC control circuit during a 100 ns ESD event (Y-axis) as a function of time (X-axis). The current ramps up to a maximum value at which at every 4 division of the current ramp each of the gate of each cell NMOS will be induced/raised a small voltage that provide enough to induce enough substrate current to trigger the parasitic BJT as the ESD signal ramps up from 0 to 30V in 100 ns and the current decays rapidly as the ESD signal is shunted to ground by the parasitic conduction of the stacked MOSFET. Simulated plots 402, 404, 406 and 408 shown in FIG. 4A were performed using commercially available circuit simulation software SPICE.

Simulated plot 406 illustrates gate-to-source voltage VGS as a function of time for each one of the 4 NMOSFET cells. As the ESD signal ramps up from 0 to 30V in 100 ns, VGS for each of the 4 NMOSFET's ramp up from 0 to about 1.5 V at different rates due to the cascaded turn on of the 4 NMOSFETs.

Simulation graph 408 illustrates drain-to-source voltage as a function of time for each one of the 4 NMOSFET cells. As the ESD signal ramps up from 0 to 30V in 100 ns, YDS for each of the 4 NMOSFET's ramp up from 0 V to about 8 V at different rates due to the cascaded turn on of the 4 NMOSFETs. After about 100 ns, a VDS holding voltage of about 7.5 V is maintained.

Figure 4B:
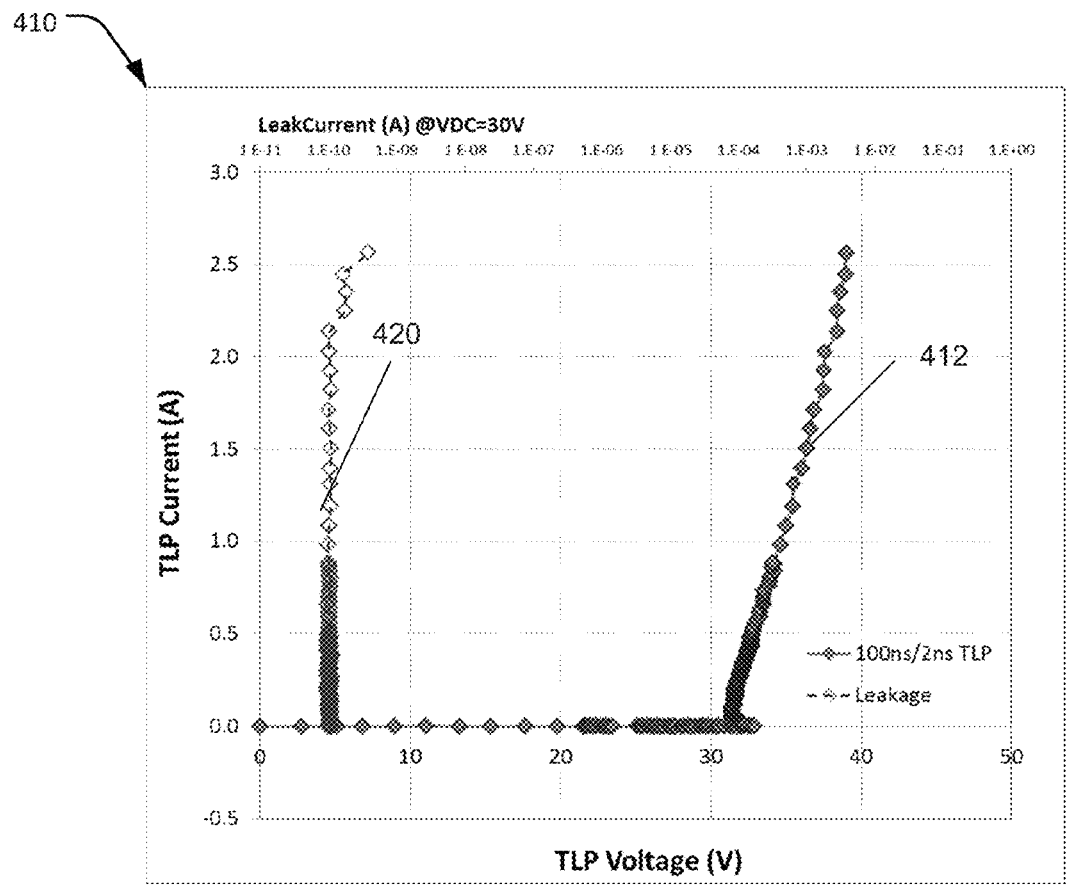
FIG. 4B illustrates in graphical form real silicon data plot of a 100 nano second (ns) transmission line pulse (TLP) response of a 4 RC-stacked FET circuit described with reference to FIGS. 1A, 1B, 1C, and 1D.

FIG. 4B is a transmission line pulse (TLP) silicon data 410 of 4 RC-stacked 6V SBLK NMOS in 0.18 μm BCD process described with reference to FIG. 1A. Current pulse with a pulse width of 100 ns and a rise time of 2 ns is provided by a commercially available TLP measurement system.

TLP data 412 illustrates current (Y axis) versus voltage (X axis) (I-V) performance data in which each data point was obtained from a current pulse that reflected across the 4 RC-stacked SBLK NMOS with 50 ohm termination. Each current pulse represents the HBM which is characterized by: 2 ns rise time and 100 ns pulse width. The 500 ns pulse length and current levels up to 2.5 A is greater than the standard JEDEC 2 kV HBM requirement (e.g., the HBM 2 kV specification typically requires a TLP around 1.33 A). Slope of the graph 410 is indicative of the on resistance RON of the 4 RC-stacked FET circuit.

TLP graph 420 illustrates I-V performance data for a normal operating state of the RC-stacked FET circuit with ESD protection (e.g., in absence of an ESD event). Graph 420 is a plot of leakage of the device after each succession TLP current pulse. TLP IV and leakage (Ioff) at VDD=30V as described with reference to FIG. 4B, were measured alternatively, e.g., by zapping with TLP pulse and reflected IV extracted, DC Ioff measurement was followed and recorded, and these repetitive measurement actions were continued with increasing TLP zapping current until the device breakdown occurs. Thus, various embodiments of a RC-stacked FET circuit with ESD protection described with reference to FIGS. 1A, 1B, 1C, 1D, 2A, 2B, 2C, and 3 provide improved ESD protection to electronic devices while concurrently improving their HV performance.

Figure 5:
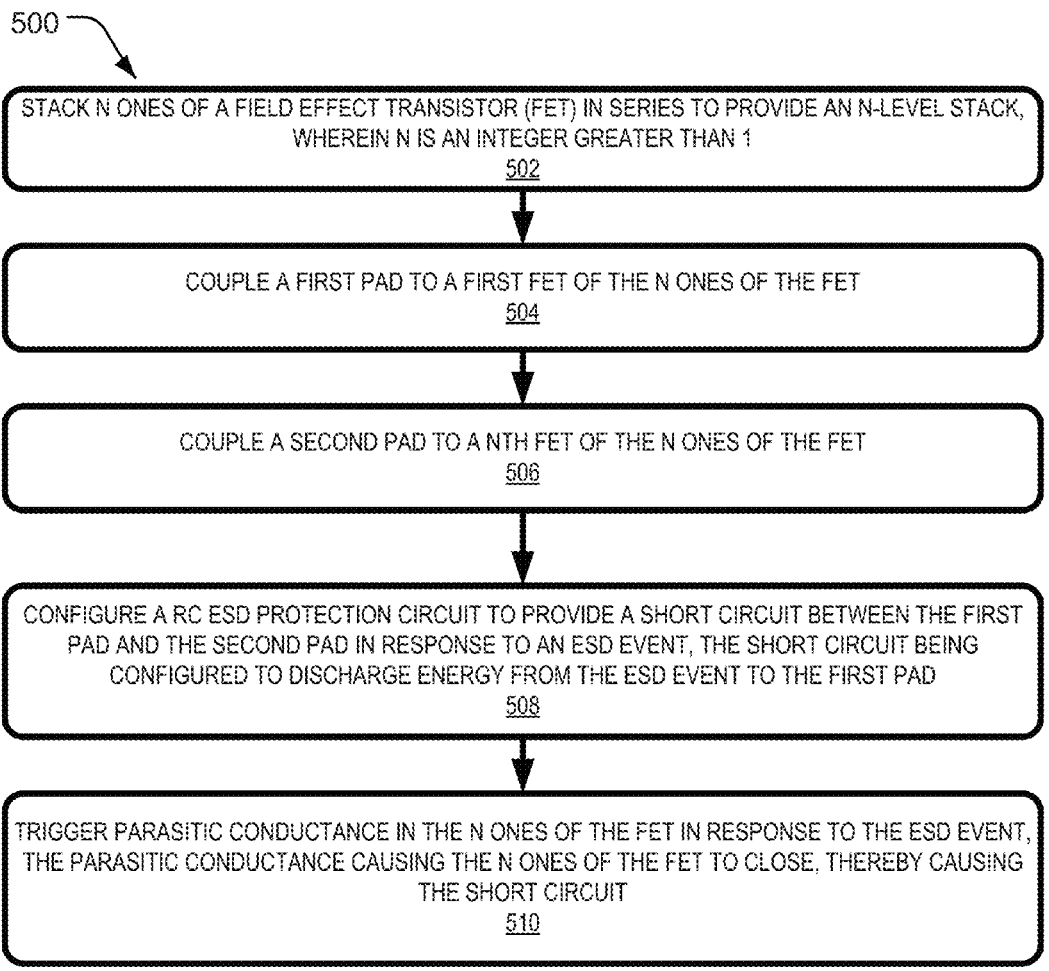
FIG. 5 is a flow diagram illustrating a process to implement techniques described herein to protect a HV device in response to an ESD event.

FIG. 5 is a flow diagram illustrating a process 500 to implement techniques described herein to protect a HV device in response to an ESD event including a RC-stacked FET circuit with ESD protection described with reference to FIGS. 1A, 1B, 1C, 1D, 2A, 2B, 2C, 3, and 4A and 4B. The process 500 begins at operation 502 in which N ones of a field effect transistor (FET) are stacked in series to provide an N-level stack, wherein N is an integer greater than 1. At operation 504, a first pad is coupled to a first FET of the N ones of the FET. At operation 506, a second pad is coupled to an Nth FET of the N ones of the FET. At operation 508, a RC control circuit is configured to provide a short circuit between the first pad and the second pad in response to an ESD event, the short circuit being configured to discharge energy from the ESD event to the first pad. At operation 510, parasitic conductance in the N ones of the FET is triggered by the ESD event, the parasitic conductance causing the N ones of the FET to close, thereby causing the short circuit.

The order in which any process or method described herein is not intended to be construed as a limitation, and any number of the described process blocks can be combined in any order to implement the process, method or alternate method. For example, as a part of operation 510, the triggering of the parasitic conductance may include inducing a base current in a parasitic NPN BJT in the N ones of the FET. Additionally, individual blocks may be deleted from the process without departing from the spirit and scope of the subject matter described herein. Furthermore, the process may be implemented in any suitable hardware, software, firmware, or a combination thereof, without departing from the scope of the invention.

The term "techniques," for instance, may refer to one or more devices, apparatuses, systems, methods, and articles of manufacture, as indicated by the context described herein. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
    N number of transistors stacked in series to provide an N-level stack, wherein N is an integer greater than 1, wherein
        a transistor includes a gate terminal and first and second source/drain (S/D) terminals, the gate of the transistor is disposed between the first and second S/D terminals, and
        a second S/D terminal of an $i^{th}$ transistor is coupled to a first S/D terminal of the $i^{th}$+1 transistor, where i is from 1 to N;
    a first pad is coupled to a first S/D terminal of the first transistor;
    a second pad is coupled to the second S/D terminal of the $N^{th}$ transistor; and
    a RC control circuit configured to cause a short circuit between the first pad and the second pad in response to an electrostatic discharge (ESD) event, wherein the RC control circuit is configured to concurrently provide sufficient voltage to control the N transistors, wherein the N transistors are turned on by parasitic conduction to cause the short circuit, the RC control circuit comprises
        N resistors, wherein an $i^{th}$ resistor is coupled between a first S/D terminal of the $i^{th}$ transistor and an $i^{th}$ gate terminal of the $i^{th}$ transistor, and
        at least one capacitor having a first capacitor terminal coupled to the first gate of the first transistor (i=1) and a second capacitor terminal coupled to the second S/D terminal of the $N^{th}$ transistor.

2. A device, comprising:
    N ones of a field effect transistor (FET) stacked in series to provide an N-level stack, wherein N is an integer greater than 1,
        a first pad coupled to a first FET and a second pad coupled to an $N^{th}$ FET; and
    a RC control circuit configured to cause a short circuit between the first pad and the second pad in response to an electrostatic discharge (ESD) event, wherein the RC control circuit is configured to concurrently provide sufficient voltage to control the N ones of the FET, wherein the N ones of the FET are turned on by parasitic conduction to cause the short circuit, wherein the RC control circuit includes
        at most N capacitors coupled in series between the second pad and a gate of the first FET, wherein a value of the at most N capacitors is configured to provide a uniform gate potential to the N ones of the FET, and
        N resistors corresponding to the N ones of the FET respectively, wherein a first resistor is coupled between the gate of the first FET and the first pad, wherein the N resistors are configured to provide the sufficient voltage to a gate of each one of the N ones of the FET respectively in response to the ESD event, thereby triggering the parasitic conduction to close the N ones of the FET in a cascaded manner.

3. The device of claim 2, wherein at least one junction between the at most N capacitors is coupled to the gate of at least one of the N ones of the FET to provide the uniform gate potential.

4. The device of claim 2, wherein each one of the N ones of the FET is a NMOS device, wherein (N–1) resistors are coupled between a gate and a source of the corresponding (N–1) ones of the FET respectively.

5. The device of claim 2, wherein the uniform gate potential of each one of the N ones of the FET is configured to be at most equal to a corresponding source potential of each one of the N ones of the FET in absence of the ESD event.

6. The device of claim 2, wherein the uniform gate potential is approximately between 1.5 to 2 volts, the uniform gate potential being at least equal to a trigger voltage that is sufficient to induce a base current in each one of the N ones of the FET.

7. The device of claim 6, wherein the trigger voltage is substantially less than an avalanche junction breakdown voltage of the FET.

8. The device of claim 6, wherein the base current flow turns on bipolar parasitic components in the FET.

9. The device of claim 2, wherein the N resistors are configured to have an identical value.

10. The device of claim 2, wherein a value of the at most N capacitors is configured to be equal to be one of 2, 3 and 4.

11. A device comprising:
    N ones of a field effect transistor (FET) stacked in series to provide an N-level stack, wherein N is an integer greater than 1, wherein scalable on-resistance (RON) and current limits depend on each FET being stacked; and
    a RC control circuit operable to switch an operating state of each of the N ones of the FET from an open state to a closed state in response to an ESD event, wherein the ESD event causes the RC control circuit to induce a base current in each of the N ones of the FET to trigger parasitic conduction of the N ones of the FET in a cascaded manner, wherein FET operating voltages are between supply voltages and device breakdown voltages.

12. The device of claim 11, wherein each of the N ones of the FET is fabricated in an independent isolated deep N-well (DNWELL) portion of an integrated circuit chip.

13. The device of claim 12, wherein the parasitic conduction occurs in a moderately doped P region (LVPWELL) located within the DNWELL.

14. The device of claim 13, wherein a mode of current conduction in the LVPWELL switches from surface conduction to bipolar conduction through bulk substrate in response to the switch from the open state to the closed state.

15. A method comprising:
   stacking N ones of a field effect transistor (FET) in series to provide an N-level stack, wherein N is an integer greater than 1;
   coupling a first pad to a first FET of the N ones of the FET;
   coupling a second pad to an $N^{th}$ FET of the N ones of the FET;
   configuring a RC control circuit to provide a short circuit between the first pad and the second pad in response to an ESD event, the short circuit being configured to discharge energy from the ESD event to the first pad, wherein the RC control circuit is configured to include N capacitors coupled in series between the second pad and a gate of the first FET, wherein the RC control circuit is further configured to remove a configurable number of capacitors from the N capacitors to reduce surface area; and
   triggering parasitic conductance in the N ones of the FET, the parasitic conductance causing the N ones of the FET to close, thereby causing the short circuit.

16. The method of claim 15, further comprising:
   inducing a base current in a parasitic NPN BJT in the N ones of the FET in response to the ESD current, wherein the base current causes the triggering of the parasitic conductance.

17. The method of claim 15, wherein the RC control circuit is further configured to distribute sufficient voltage to a gate of the N ones the FET, a value of the sufficient voltage being used to operate the N ones the FET in one of an open state and a closed state.

18. The method of claim 15, wherein each of the N ones of the FET is fabricated in an independent isolated deep N-well (DNWELL) portion of an integrated circuit chip.

19. The method of claim 15, wherein the RC control circuit is configured to include N resistors, wherein the N resistors are equal in value.

20. The method of claim 15, wherein the triggering of the parasitic conductance in the N ones of the FET occurs in a cascaded manner.

21. A method comprising:
   providing a substrate;
   forming shallow trench isolation regions in the substrate;
   forming N-level RC stacked FET circuit with ESD protection which comprises
      forming N ones of field effect transistor (FET) and resistors in series on the substrate, wherein forming N ones of FET comprises providing a gate layer over the substrate, wherein the gate layer is patterned to define gates of the FETs and resistors, wherein the resistor is formed over the shallow trench isolation region which isolates adjacent FETs, and
      forming capacitor structures over the substrate;
   forming interlevel dielectric (ILD) and intermetal dielectric (IMD) layers over the substrate; and
   forming interconnects which include metal lines and via contacts in the ILD and IMD layers, wherein the interconnects couple the gates, capacitors and resistors to form the N-level RC stacked FET circuit.

* * * * *